US008373464B2

(12) United States Patent
Sornin

(10) Patent No.: US 8,373,464 B2
(45) Date of Patent: Feb. 12, 2013

(54) DIGITAL PHASE-LOCKED LOOP ARCHITECTURE

(75) Inventor: Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/264,334

(22) PCT Filed: Apr. 7, 2010

(86) PCT No.: PCT/EP2010/054599
§ 371 (c)(1),
(2), (4) Date: Dec. 29, 2011

(87) PCT Pub. No.: WO2010/118980
PCT Pub. Date: Oct. 21, 2010

(65) Prior Publication Data
US 2012/0105120 A1    May 3, 2012

(30) Foreign Application Priority Data
Apr. 14, 2009    (GB) .................................. 0906418.9

(51) Int. Cl.
*H03L 7/06* (2006.01)
(52) U.S. Cl. ........................................ 327/156; 327/147
(58) Field of Classification Search ................. 327/147, 327/156
See application file for complete search history.

(56) References Cited

U.S. PATENT DOCUMENTS

| 7,242,224 | B1 * | 7/2007 | Li et al. ........................ 327/105 |
| 7,436,227 | B2 * | 10/2008 | Thomsen et al. ............. 327/147 |
| 7,616,073 | B1 * | 11/2009 | Taheri et al. .................. 331/176 |
| 7,893,775 | B2 * | 2/2011 | Luiz et al. ....................... 331/25 |
| 7,978,014 | B2 * | 7/2011 | Chen et al. ..................... 331/16 |
| 8,050,376 | B2 * | 11/2011 | Liu et al. ....................... 375/376 |
| 2001/0036240 | A1 | 11/2001 | Gossmann et al. |
| 2002/0033737 | A1 * | 3/2002 | Staszewski et al. ............. 331/17 |
| 2002/0089356 | A1 * | 7/2002 | Perrott et al. ................. 327/105 |
| 2003/0218509 | A1 | 11/2003 | Unterricker |
| 2004/0232995 | A1 * | 11/2004 | Thomsen et al. ................ 331/2 |
| 2004/0232997 | A1 * | 11/2004 | Hein et al. ....................... 331/16 |
| 2004/0263225 | A1 * | 12/2004 | Perrott et al. ................. 327/156 |
| 2005/0220241 | A1 * | 10/2005 | Zhang et al. .................. 375/376 |
| 2005/0285692 | A1 * | 12/2005 | Mattila et al. ................. 331/175 |
| 2006/0056561 | A1 * | 3/2006 | Zhang .......................... 375/376 |

(Continued)

FOREIGN PATENT DOCUMENTS

| EP | 0209754 A2 | 1/1987 |
| WO | 2004/059844 A2 | 7/2004 |

OTHER PUBLICATIONS

International preliminary Report on Patentability, WIPO, Oct. 18, 2011.

*Primary Examiner* — Adam Houston
(74) *Attorney, Agent, or Firm* — Novak Druce DeLuca + Quigg LLP

(57) ABSTRACT

A phase-locked loop circuit comprising: an oscillator (20) configured to generate an output signal; an input (25) for receiving a reference clock signal; a delay cell (26) configured to delay the reference clock signal to generate a delayed reference clock signal; a phase comparator (27) configured to generate a quantized signal indicative of the phase difference between the output signal and the delayed reference clock signal, an integrator (28) configured to integrate the quantized signal to form an integrated signal; a first feedback path (22) configured to control the phase and/or frequency of the oscillator in dependence on the integrated signal; and a second feedback path (23) configured to adjust the delay applied by the delay cell (26) in dependence on the integrated signal.

21 Claims, 3 Drawing Sheets

U.S. PATENT DOCUMENTS

| | | |
|---|---|---|
| 2007/0052463 A1* | 3/2007 | Abel et al. .................... 327/158 |
| 2007/0057737 A1* | 3/2007 | Davis et al. .................... 331/17 |
| 2007/0085579 A1* | 4/2007 | Wallberg et al. ............. 327/156 |
| 2007/0121772 A1 | 5/2007 | Wada |
| 2008/0157884 A1* | 7/2008 | Lee ................................ 331/44 |
| 2009/0039968 A1* | 2/2009 | Thomsen et al. ............... 331/10 |
| 2009/0219067 A1* | 9/2009 | Kizer ........................... 327/156 |
| 2009/0243677 A1* | 10/2009 | Becker et al. ................. 327/158 |
| 2010/0007391 A1* | 1/2010 | Mehas et al. ................. 327/158 |
| 2010/0289541 A1* | 11/2010 | Wu ................................ 327/158 |
| 2010/0295586 A1* | 11/2010 | Weiner .......................... 327/157 |
| 2011/0074475 A1* | 3/2011 | Akaike et al. ................. 327/156 |
| 2011/0248752 A1* | 10/2011 | Willey et al. .................. 327/117 |
| 2011/0249519 A1* | 10/2011 | Tamura .................... 365/189.15 |
| 2012/0049907 A1* | 3/2012 | Da Dalt et al. ................ 327/147 |
| 2012/0056765 A1* | 3/2012 | Hode ............................ 341/110 |
| 2012/0081159 A1* | 4/2012 | Wu ............................... 327/156 |
| 2012/0105120 A1* | 5/2012 | Sornin .......................... 327/158 |

\* cited by examiner

DIGITAL PHASE-LOCKED LOOP ARCHITECTURE

This invention relates to an architecture whereby one or more parts of a phase-locked loop (PLL) can be implemented in the digital domain.

A phase-locked loop is a circuit including a voltage controlled oscillator (VCO) which is designed to control the VCO to generate an output signal having a predetermined frequency and/or phase relationship with a reference signal. A typical phase-locked loop is shown in FIG. 1.

The phase-locked loop comprises an oscillator 101. The output of the oscillator is output from the phase-locked loop circuit on line 105. Additionally, the output of the oscillator 101 is fed to an input of a phase/frequency detector (PFD) 102. The PFD 102 outputs a signal that is representative of the phase and/or frequency difference between a reference signal on line 106 and the signal output from the oscillator. The PFD output signal is filtered at a low pass filter 103 (loop filter) and fed back into the oscillator 101 as a control signal on line 107. The control signal 107 modifies the natural frequency of the oscillator. The frequency of the signal output by the phase-locked loop on line 105 can be changed by varying the frequency of the reference signal. Often, the reference signal is generated by a very stable oscillator whose frequency cannot be varied. Therefore, it can be beneficial to include a divider 104 in the loop so that the output frequency of the phase-locked loop can be varied without having to change the frequency of the reference signal.

Variations due to process between analogue devices mean that operations in the analogue domain can vary dependent on process factors. On the other hand, operations in the digital domain are largely process-independent and deterministic. Therefore, in many situations it would be desirable to implement as much of a PLL as possible in the digital domain. This is especially so when implementing a PLL on an integrated circuit, where process variability can be especially problematic.

In prior designs that implement PLLs with substantial digital processing there is a step of transforming the signal that represents the VCO phase error from analogue to digital, and that step limits the maximum closed-loop bandwidth that can be achieved. One way to get around this problem would be to implement A-to-D conversion of the VCO phase error with sufficient precision that the residual phase noise is within acceptable bounds. To estimate those bounds it may be considered that a digital PLL is a sampled system whose over-sampling ratio (OSR) is $F_{ref}/BW_{PLL}/2$, where $F_{ref}$ is the reference frequency and $BW_{PLL}$ is the bandwidth of the PLL loop. Taking practical values of 40 MHz for $F_{ref}$ and 1 MHz for $BW_{PLL}$, this gives an OSR of approximately 20. The noise of the phase detector is attenuated by db10(OSR) if this noise is uniformly spread across the frequency band from 0 to $F_{ref}/2$. Therefore, the minimum residual phase noise that the PLL can achieve is $E/\sqrt{OSR}$, where E is the RMS VCO phase error. A typical target for wireless radio systems is a residual phase noise of 3 degrees. The above estimation indicates that to achieve this target the RMS VCO phase error would have to be $3*\sqrt{20}$, which is approximately 14 degrees RMS. But digital PLLs having such accuracy are not commonly available.

An alternative way to implement a satisfactory digital PLL would be to increase the reference clock frequency. However, significantly higher reference clock frequencies imply faster operation of the PLL and require enhanced circuitry to generate and process the clock signal.

There is therefore a need for an improved design of PLL that can more readily be implemented with high accuracy using at least some components that operate in the digital domain.

According to the present invention there is provided: a phase-locked loop circuit comprising: an oscillator configured to generate an output signal; an input for receiving a reference clock signal; a delay cell configured to delay the reference clock signal to generate a delayed reference clock signal; a phase comparator configured to generate a quantised signal indicative of the phase difference between the output signal and the reference clock signal; an integrator configured to integrate the quantised signal to form an integrated signal; a first feedback path configured to control the phase and/or frequency of the oscillator in dependence on the integrated signal; and a second feedback path configured to adjust the delay applied by the delay cell in dependence on the integrated signal.

The first feedback path may comprise a first low-pass filter configured to low-pass filter the integrated signal. The first feedback path may be configured to control the phase and/or frequency of the oscillator in dependence on the output of the first low-pass filter.

The first low-pass filter may be implemented in the digital domain. The first feedback path may comprise a first digital-to-analogue filter for converting the output of the first low-pass filter to the analogue domain. The first feedback path may be configured to control the phase and/or frequency of the oscillator in dependence on the output of the first analogue to digital converter.

The first feedback path may comprise a second low-pass filter configured to low-pass filter in the analogue domain the output of the first digital-to-analogue converter. The first feedback path may be configured to control the phase and/or frequency of the oscillator in dependence on the output of the second low-pass filter.

The phase-locked loop may comprise a phase control input for receiving a first phase control signal. The first feedback path may comprise means for combining with the output of the first low pass filter a first phase modulation command signal.

The integrator may be implemented in the digital domain. The integrator may be an accumulator that is configured to accumulate the quantised signal to form an accumulated value, the instantaneous value of the integrated signal being the accumulated value.

The second feedback path may comprise means for combining with the output of the integrator one or both of a second phase modulation command signal and a frequency division signal.

The phase-locked loop may comprise an input for receiving a frequency division command, and a second integrator configured to integrate the frequency division command to form the frequency division signal.

The second feedback path may comprise an amplifier for amplifying the integrated signal, the second feedback path being configured to control the delay applied by the delay cell in dependence on the output of the amplifier. The amplifier may be a digital amplifier.

The second feedback path may comprise a second digital-to-analogue converter for converting a signal derived from the integrated signal to the analogue domain. The second feedback path may be configured to control the delay applied by the delay cell in dependence on the output of the second digital-to-analogue converter.

The phase comparator may be a sampling device clocked by the delayed reference clock signal to sample the output signal.

The phase comparator may comprise: a pulse comparator configured to generate a signal that is representative of the phase difference between the output signal and the reference clock signal; an error-shaping circuit for error shaping the output of the pulse comparator; and a sampling circuit clocked by the delayed reference clock signal to sample the error-shaped output of the pulse comparator. The pulse comparator may be configured to generate a signal whose current is representative of the phase difference between the output signal and the reference clock signal.

The error-shaping circuit may comprise: a current source configured to add to the output of the pulse comparator a current dependent on the quantised signal; and an integrator for integrating the signal at the output of the pulse comparator.

The integrator may be a capacitor connected between the output of the pulse comparator and a reference voltage.

The sampling circuit may comprise: a comparator circuit for comparing the voltage at the output of the pulse comparator with first and second thresholds and for generating a quantised output having a first form if that voltage is below both the first and second thresholds, a second form if that voltage is between the first and second thresholds and a third form if that voltage is above both the first and second thresholds; and a sampling device clocked by the delayed reference clock signal to sample the output of the comparator circuit.

The integrator may be implemented in the digital domain.

The phase-locked loop may be implemented on a single integrated circuit.

According to another aspect of the present invention there is provided a radio transmitter or receiver comprising a phase-locked loop as set out above.

The present invention will now be described by way of example with reference to the accompanying drawings. In the drawings.

Figure 2:
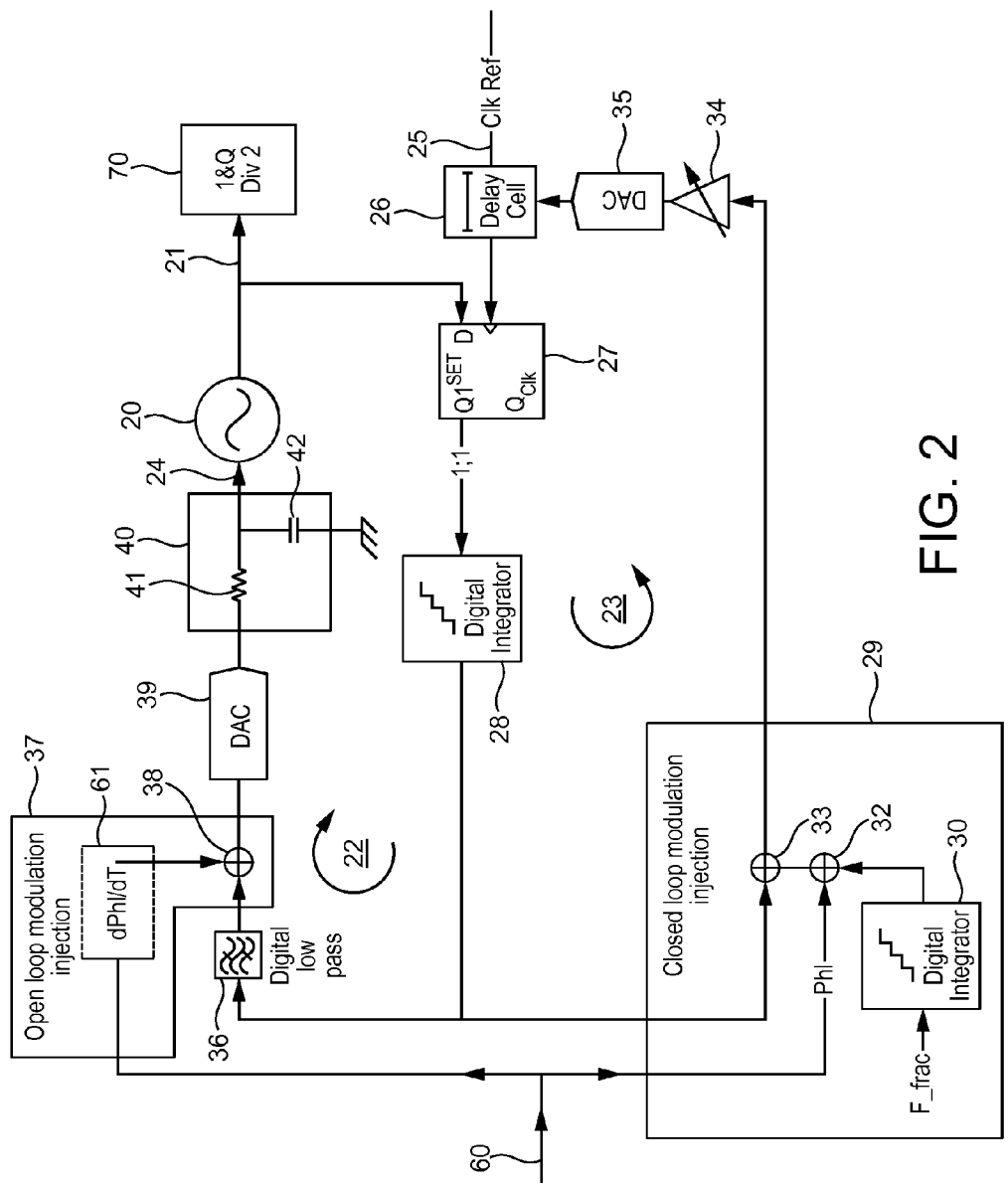
FIG. 2 is a schematic diagram of a first alternative form of PLL.

The PLL of FIG. 2 comprises a voltage-controlled oscillator (VCO) 20 which generates an output from the loop at 21. Broadly, the PLL comprises two feedback loops: an upper loop indicated generally at 22 in FIG. 2 and a lower loop indicated generally at 23. A reference clock signal is received by the PLL circuit at input 25. The reference clock passes through a delay cell 26 before being input to the upper and lower loops. The upper loop includes the oscillator 20 and generates a control signal dependent on the reference clock signal that is input to the oscillator at 24 to control the phase and frequency of the oscillator. The lower loop controls the amount of delay applied by the delay cell. The upper loop could be seen as being the analogue of the phase-locked loop of a conventional PLL. The lower loop constitutes a phase tracking loop that causes the effective reference clock (at the output of the delay cell) to track the VCO, improving the precision of the PLL.

The output of the delay cell 26 is a delayed version of the reference clock signal at 25. The delayed reference clock signal is input to a latch 27, which in this implementation is a D-type flip-flop. The delayed reference clock signal is input to the clock input of the flip-flop 27. The output of the oscillator is connected to the sampling (D) input of the flip-flop. In this configuration the flip-flop samples the polarity of the oscillator's output at each rising edge of the delayed reference clock signal and outputs a digital signal signifying +1 or −1 accordingly. If the output of the oscillator has positive polarity when sampled then the quantised output is +1, and otherwise it is −1. The signal from the flip-flop is integrated by a counter/accumulator 28. The counter 28 maintains an accumulated value which it sums with the +1 or −1 output of the flip-flop. The result of that sum becomes the new accumulated value and represents the output of the counter. The counter may be clocked by the delay cell, or by another clock.

The latch 27 and the accumulator 28 are common to the upper and lower loops. However, one or both of them could be duplicated so as to be individual to each loop.

In the path of the lower loop, the output of the counter 28 passes to a block 29 which injects a closed loop modulation stimulus to the second loop. A F_frac (fractional F) signal is integrated in integrator 30. The integrator may be of any suitable design. The output of the integrator is added to a phase control signal in adder 32. The output of adder 32 is a modulation signal which is added to the output of counter 28 in adder 33. The output of adder 33 is amplified by variable amplifier 34. The output of variable amplifier 34 is converted to the analogue domain by digital-to-analogue converter (DAC) 35. The output of DAC 35 is input to the delay cell and sets the delay applied by the delay cell. A filter or other means may be inserted between DAC 35 and the delay cell so that the delay cell is controlled appropriately in dependence on the output of the DAC.

In this way, the lower loop implements phase tracking, with the output of the accumulator 28 adjusting the delay cell so that the edges of the delayed version of the clock signal continuously track the edge of the VCO output. This in turn has the effect that the output of the accumulator 28 is an precise representation of the VCO phase. In a typical practical implementation of the circuit it can be anticipated that the precision of this phase detection will be limited only by the precision of the delay cell. The precision of a practical implementation of a delay cell can readily be around 4 ps, which equates to around 3 degrees of phase at a frequency of 2.4 GHz.

In the path of the upper loop the output of the counter 28 is input to a low-pass filter 36 which low-pass filters the output of the counter. The output of the counter passes to a block 37 which injects an open loop modulation. A time-differentiated phase control signal is added to the output of the filter 36 in adder 38. The output of adder 38 is converted to the analogue domain by DAC 39. The output of DAC 39 is further low-pass filtered by an analogue low-pass filter 40, and the output of the analogue filter 40 provides the input to the oscillator 20. The analogue low-pass filter is an RC filter comprising a resistor 41 in series with the signal path and a capacitor 42 in parallel with the signal path between a node on the signal path and ground. In this way, the oscillator is controlled to track the required phase and/or frequency.

In this example of an implementation of the circuit, flip-flop 27, counter 28, integrator 30, adder 32, adder 33, amplifier 34, low-pass filter 36 and adder 38 are implemented in the digital domain. Delay cell 26 and low-pass filter 40 are implemented in the analogue domain. This is an advantageous implementation because a large proportion of the components of the circuit are implemented in the digital domain. Other implementations are possible. One or more of components 27, 28, 30, 32, 33 34 36 and 38 could independently be selected for implemented in analogue. One or more of components 26 and 40 could be implemented in digital. DACs and/or ADCs (analogue-to-digital converters) would be located accordingly.

The delay cell could, for example, provide 7 bits of delay precision over one period of the VCO. In other words, if the frequency of the VCO is $f_{VCO}$ then the delay applied by the delay cell could be adjustable in increments of $1/(128\, f_{VCO})$. The delay cell could, for instance, be implemented by means of a tapped delay line or a series of shift gates.

The counter 28 could be limited to count modulo $2^N$, where N is the number of bits of precision of the delay cell.

The bandwidth of the lower loop is suitably at least a decade bigger than that of the upper loop. The bandwidth of the upper loop will typically be fixed by the low-pass filter 36.

Phase modulation can be applied by means of a phase control input 60. The signal at input 60 is input to adder 32, and thereby passed to adder 33 in the lower loop. In this way closed loop phase modulation can injected. The signal at input 60 is also input to a differentiator 61. This differentiates the phase control signal with respect to time. The output of the differentiator circuit is passed to adder 38 in the upper loop. In this way open loop phase modulation can be injected. Either of these forms of phase control can be omitted.

Figure 1:
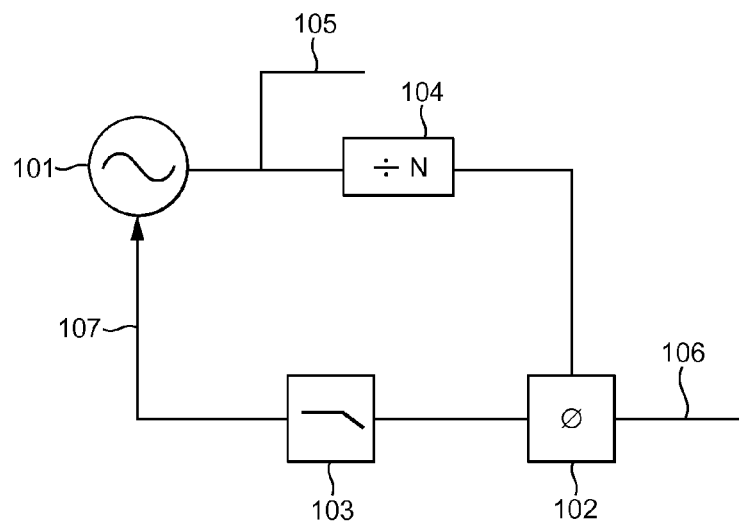
FIG. 1 is a schematic diagram of a conventional PLL.

In a conventional PLL a frequency divider is used, as at 104 in FIG. 1. It should be noted that no frequency divider is needed in the present circuit.

Figure 3:
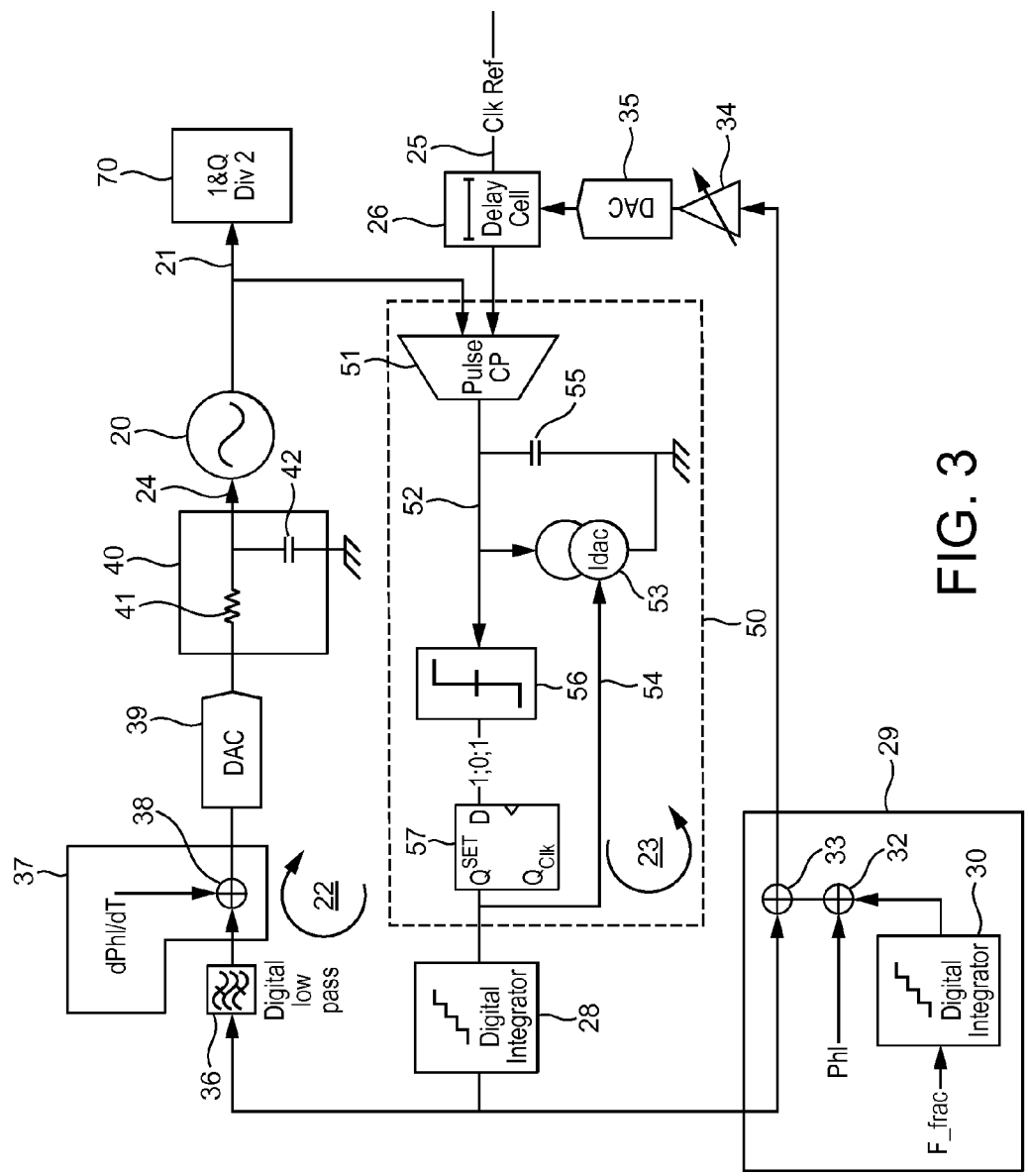
FIG. 3 is a schematic diagram of a second alternative form of PLL.

FIG. 3 shows a second example of a PLL architecture. In FIG. 3 like components are designated as in FIG. 2.

In the architecture of FIG. 3 the flip-flop 27 of FIG. 2, which acts in effect as a phase detector, is replaced by a more complex block 50. That block is intended to effect noise shaping of any error in the phase detector.

Block 50 comprises a pulse charge pump 51 which receives the output of the oscillator and the delayed version of the reference clock signal. The pulse comparator is configured so as to generate an output current at node 52 whose magnitude is proportional to the phase difference between its two inputs. The charge pump may be of any suitable design.

A current DAC (iDAC) 53 generates a current dependent on a feedback input at 54. The iDAC is connected between ground and node 52, so the current generated by the iDAC is added to the output of the pulse charge pump 51. A capacitor 55 is also connected between ground and node 52 and integrates the signal at node 52.

The signal at node 52 is input to a quantiser 56. The quantiser compares the voltage at node 52 with two voltage thresholds $T_1$ and $T_2$, $T_1$ being lower than $T_2$. The quantiser outputs a $-1$ if the voltage at node 52 is below $T_1$, a 0 if the voltage at node 52 is between $T_1$ and $T_2$, and a $+1$ if the voltage at node 52 is above $T_2$.

The quantiser could be implemented by two parallel comparators, each comparing the input voltage with a respective one of $T_1$ and $T_2$, and appropriate logic to form the required quantiser outputs from the outputs of the individual comparators.

The output of the quantiser is latched by a flip-flop 57 which is clocked by the delayed version of the reference clock, or may be clocked by another clock signal. Each output of the flip-flop ($-1$, 0 or $+1$) is summed with the accumulated total already held in counter 28, as in the circuit of FIG. 2.

The output of the flip-flop 57 provides the feedback signal at 54 that is input to the iDAC.

In the architecture of FIG. 3 the upper loop effectively implements a second order sigma-delta ADC. In this view of the circuit the VCO 20 acts as a first integrator of the sigma-delta ADC (integrating voltage to phase); the pulse charge pump 51 and capacitor 55 act together as a second integrator; the DAC 39 at the input to the VCO acts as a first feedback DAC; and the iDAC acts as a second feedback DAC. In reality the first order sigma-delta response is strongly dithered by the phase noise of the VCO. This characteristic of the circuit has a number of effects.

1. Most significantly, the phase tracking loop error is first-order noise shaped because any error is accumulated by the pulse charge pump 51 and the capacitor 55 acting as an integrator. It is especially notable that this enhances the operation of the PLL by avoiding or reducing ringing effects when operating with the oscillator frequency at an integer harmonic of the reference frequency. This allows greater flexibility in choice of reference frequency and/or oscillator output frequency.

2. Another advantage of the architecture of FIG. 3 is that it does not suffer from a metastability problem. This is because the quantiser 56 probes a signal that is significantly lower in frequency than the clock rate of the latch 57.

3. Another advantage of the architecture of FIG. 3 is that since the input to the counter 28 is quantised into three states, rather than two as in the architecture of FIG. 2, the impulse response of the circuit is smoother and more accurate.

In this example of an implementation of the circuit, flip-flop 57, counter 28, integrator 30, adder 32, adder 33, amplifier 34, low-pass filter 36 and adder 38 are implemented in the digital domain. Delay cell 26, low-pass filter 40, the pulse charge pump 51, the iDAC 53 and the integrator constituted in this example by capacitor 55 are implemented in the analogue domain. This is an advantageous implementation because a large proportion of the components are implemented in the digital domain. Also, it should be noted that many of the analogue components (e.g. the iDAC, the quantiser and the pulse charge pump) can be implemented by very simple circuits. Capacitor 55 can be very small (typically less than 1 pF because—unlike in conventional analogue PLLs—in a well-balanced implementation of the circuit the range of error being accumulated will typically represent only a few degrees of VCO phase noise. Similarly, the noise level of the iDAC is relatively insignificant.

Other implementations are possible. One or more of components 57, 28, 30, 32, 33, 34, 36 and 38 could independently be selected for implementation in analogue. One or more of components 26, 40 51, 53 and 55 could independently be selected for implementation in digital. DACs and/or ADCs would be located accordingly.

Practical implementations of the circuits of FIGS. 2 and 3 may have an accuracy of less than 3 degrees of phase at an operating frequency of 2.4 GHz, with many of the circuit components being implemented in the digital domain. The ratio of the bandwidth of the upper loop to the reference frequency can be as high as around 1:10 or 1:20: for instance a bandwidth for the upper loop of around 1 MHz might be chosen for a reference clock operating at 19.2 MHz.

In the circuits of FIGS. 2 and 3 the central components are shared by the upper and lower loops. This is an efficient implementation, but alternatively separate components could be implemented for each loop.

The entire circuit of FIG. 2 or 3 or part of it may be implemented on an integrated circuit. Preferably the entire circuit is implemented on a single integrated circuit.

The output of the oscillator is preferably at radio frequency. It may, for example, be used for modulating, demodulating, upconverting or downconverting a signal in a radio transmitter and/or receiver. The circuit may be put to other uses, as with other designs of PLL. In a transmitter or receiver the output 21 may pass to a divide-by-two circuit 70 which forms in-phase and quadrature (I and Q) signals.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A phase-locked loop circuit comprising:
   an oscillator configured to generate an output signal;
   an input for receiving a reference clock signal;
   a delay cell configured to delay the reference clock signal to generate a delayed reference clock signal;
   a phase comparator configured to generate a quantised signal indicative of the phase difference between the output signal and the reference clock signal;
   an integrator configured to integrate the quantised signal to form an integrated signal;
   a first feedback path configured to control the phase and/or frequency of the oscillator in dependence on the integrated signal; and
   a second feedback path configured to adjust the delay applied by the delay cell in dependence on the integrated signal.

2. A phase-locked loop as claimed in claim 1, wherein the first feedback path comprises a first low-pass filter configured to low-pass filter the integrated signal, the first feedback path being configured to control the phase and/or frequency of the oscillator in dependence on the output of the first low-pass filter.

3. A phase-locked loop as claimed in claim 2, wherein the first low-pass filter is implemented in the digital domain and the first feedback path comprises a first digital-to-analogue filter for converting the output of the first low-pass filter to the analogue domain, the first feedback path being configured to control the phase and/or frequency of the oscillator in dependence on the output of the first analogue to digital converter.

4. A phase-locked loop as claimed in claim 3, wherein the first feedback path comprises a second low-pass filter configured to low-pass filter in the analogue domain the output of the first digital-to-analogue converter, the first feedback path being configured to control the phase and/or frequency of the oscillator in dependence on the output of the second low-pass filter.

5. A phase-locked loop as claimed in any of claims 2 to 4, comprising a phase control input for receiving a first phase control signal, and wherein the first feedback path comprises means for combining with the output of the first low pass filter a first phase modulation command signal.

6. A phase-locked loop as claimed in any preceding claim, wherein the integrator is implemented in the digital domain.

7. A phase-locked loop as claimed in claim 6, wherein the integrator is an accumulator that is configured to accumulate the quantised signal to form an accumulated value, the instantaneous value of the integrated signal being the accumulated value.

8. A phase-locked loop as claimed in any preceding claim, wherein the second feedback path comprises means for combining with the output of the integrator one or both of a second phase modulation command signal and a frequency division signal.

9. A phase-locked loop as claimed in claim 8, comprising an input for receiving a frequency division command, and a second integrator configured to integrate the frequency division command to form the frequency division signal.

10. A phase-locked loop as claimed in any preceding claim, wherein the second feedback path comprises an amplifier for amplifying the integrated signal, the second feedback path being configured to control the delay applied by the delay cell in dependence on the output of the amplifier.

11. A phase-locked loop as claimed in claim 10, wherein the amplifier is a digital amplifier.

12. A phase-locked loop as claimed in any preceding claim, wherein the second feedback path comprises a second digital-to-analogue converter for converting a signal derived from the integrated signal to the analogue domain and the second feedback path is configured to control the delay applied by the delay cell in dependence on the output of the second digital-to-analogue converter.

13. A phase-locked loop as claimed in any preceding claim, wherein the phase comparator is a sampling device clocked by the delayed reference clock signal to sample the output signal.

14. A phase-locked loop as claimed in any of claims 1 to 12, wherein the phase comparator comprises:
    a pulse comparator configured to generate a signal that is representative of the phase difference between the output signal and the reference clock signal;
    an error-shaping circuit for error shaping the output of the pulse comparator; and
    a sampling circuit clocked by the delayed reference clock signal to sample the error-shaped output of the pulse comparator.

15. A phase-locked loop as claimed in claim 14, wherein the pulse comparator configured to generate a signal whose current is representative of the phase difference between the output signal and the reference clock signal.

16. A phase-locked loop as claimed in claim 14 or 15, wherein the error-shaping circuit comprises:
    a current source configured to add to the output of the pulse comparator a current dependent on the quantised signal; and
    an integrator for integrating the signal at the output of the pulse comparator.

17. A phase-locked loop as claimed in claim 16, wherein the integrator for integrating the signal at the output of the pulse comparator is a capacitor connected between the output of the pulse comparator and a reference voltage.

18. A phase-locked loop as claimed in any of claims 14 to 17, wherein the sampling circuit comprises:
    a comparator circuit for comparing the voltage at the output of the pulse comparator with first and second thresholds and for generating a quantised output having a first form if that voltage is below both the first and second thresholds, a second form if that voltage is between the first and second thresholds and a third form if that voltage is above both the first and second thresholds; and
    a sampling device clocked by the delayed reference clock signal to sample the output of the comparator circuit.

19. A phase-locked loop as claimed in any preceding claim, wherein the integrator is implemented in the digital domain.

20. A phase-locked loop as claimed in any preceding claim, the phase-locked loop being implemented on a single integrated circuit.

21. A radio transmitter or receiver comprising a phase-locked loop as claimed in any preceding claim.

* * * * *